United States Patent [19]

Jobbins

[11] Patent Number: 4,528,245
[45] Date of Patent: Jul. 9, 1985

[54] PRETREATMENT OF PLASTIC MATERIALS FOR METAL PLATING

[75] Inventor: Jill M. Jobbins, Elbridge, N.Y.

[73] Assignee: Allied Corporation, Morris Township, Morris County, N.J.

[21] Appl. No.: 583,916

[22] Filed: Feb. 27, 1984

[51] Int. Cl.$^3$ .......................... B05D 1/18; B05D 3/10; B32B 15/04; B32B 15/08
[52] U.S. Cl. .................................. 428/457; 204/38.4; 427/304; 427/306; 427/322; 427/437; 427/438; 428/462
[58] Field of Search ............... 427/306, 304, 322, 437, 427/438; 204/38 B; 428/457, 462

[56] References Cited

U.S. PATENT DOCUMENTS 3,751,287  8/1973  Baier et al. ................... 427/322 X
4,039,714  8/1977  Roubal et al. .................... 428/336
4,422,907  12/1983  Birkmaier et al. ............... 204/38 B Primary Examiner—Michael R. Lusignan
Attorney, Agent, or Firm—Richard C. Stewart, II

[57] ABSTRACT

This invention relates to a process for conditioning the surfaces of natural and synthetic plastic materials for electroless plating of a metal coating thereon by exposing such materials to an atmosphere comprising ozone, contacting said exposed materials with a conditioning solvent, such as an aqueous solution of sodium, potassium or lithium hydroxide, and thereafter rinsing said contacted materials with an aqueous solution of one or more surfactants.

29 Claims, No Drawings

PRETREATMENT OF PLASTIC MATERIALS FOR METAL PLATING

DESCRIPTION

BACKGROUND OF THE INVENTION

1. Field of the Invention

This invention relates to a process for the conditioning of plastic materials and plastic articles which are to be metal plated through use of conventional electroless and electroplating techniques. More particularly, this invention relates to an improved process for surface conditioning of such plastic materials and plastic articles so as to provide them with prolonged hydrophilic surfaces. This conditioning permits electroless and electroplating of said materials and articles to provide continuous metal plated surfaces which possess superior adhesive properties as compared to metal surfaces plated onto untreated surfaces. This invention also relates to products produced by the process of this invention.

2. Description of the Prior Art

In recent years, electroplating and metallic coating of plastics has become of ever increasing importance. In order to manufacture plastics having firmly bonded metal coatings, the plastic must be subjected to a pretreatment step, during which the surfaces of the plastic are treated to increase adhesion characteristics of metal surfaces coated thereon. Heretofore, various methods have been employed in such a pretreatment step. For example, in one such prior art method, the surfaces of the plastic are treated with a mixture of chromium trioxide, sulfuric acid and water, or a mixture of such ingredients and phosphoric acid. While relatively effective, this method suffers a number of disadvantages. For example, the efficiency of this method is very much dependent on the type of plastic to be treated; and accordingly it is mainly confined to use in the pretreatment of a narrow class of plastics. Thus, the process does not have universal applicablility for a wide range of assorted plastics.

Another disadvantage of this known method is that the relative amounts of components in the chromium trioxide containing pre-treatment solution must be maintained within a pre-determined and rather narrow range of concentrations. Only deviations of a few percent from these optimum amounts are permissible. Otherwise, on subsequent chemical deposition of the metal, the plastic surface is not completely coated by the metal and/or the entire coating does not possess sufficiently high peel strength. In addition, in this known method, the pretreatment solution becomes useless as soon as the concentration levels of the degradation products of the plastic and of the trivalent chromium compounds in the solution reach a certain level. Thus, constant analytical supervision and dosing of the chemicals consumed and monitoring of the degradation products produced during the conduct of this known pretreatment method is required. This continual control of the process considerably complicates its conduct.

Still another disadvantage of this known pretreatment process results from difficulties associated with the disposal of the used composition. To eliminate the used pretreatment composition, it is necessary to reduce the hexavalent chromium compounds and then to neutralize the reduction product. In the neutralization procedure, large amounts of highly voluminous chromium hydroxide are formed, the removal of which considerably encumbers the disposal of the used composition. Thus, the disposal of the used pretreatment composition also complicates the conduct of the process and requires considerable expenditures of time, capital, technical apparatus and plants.

Lastly, the pretreatment composition of this known process is very corrosive, and extensive washings with water are required to completely remove it from the plastic surface being pretreated. The result is a further increase in process time and expense.

Another prior art process for pretreating plastic surfaces to enhance the peel strength of metal surfaces electroless or electroplated thereon is disclosed in U.S. Pat. No. 4,039,714. In this process, the surfaces of the plastic to be electroplated are pretreated by exposing them to an atmosphere containing sulfur trioxide. This known pretreatment process also suffers from several inherent disadvantages. For example, sulfur trioxide is an extremely toxic substance, which reacts with atmospheric moisture to form sulfuric acid which is extremely corrosive and dangerous. Thus, when using sulfur trioxide extreme care must be taken to prevent contact with human skin. Furthermore, sulfur trioxide reacts violently with certain organic materials producing heat, which results in an additional hazard to users of the process. The dangerous nature of sulfur trioxide results in an increase in the time, cost and equipment required to use this process.

U.S. Pat. No. 4,422,907 discloses an improvement in processes for pre-treatment of plastic surfaces for electroplating purposes. In the process of that patent, the surfaces of the plastic material are exposed to ozone and followed by washing with an aqueous alkali solution. While the process of this patent represents a significant advancement over prior art pretreatment processes, it suffers from one disadvantage which impacts on the capability of this process to be practically and commercially operative. More specifically, this disadvantage is that conditioning of the treated surface dissipates with time. If the surface of the plastic is exposed to air after alkali conditioning and prior to treatment with the electroless plating catalyst for short periods of time for reasons of process timing, process problems and the like, the quality of the metal plate electrodeposited onto the surface is impaired.

SUMMARY OF THE INVENTION

The present invention is directed to a method of treating plastic surfaces composed of polymeric materials to achieve complete uniform plating and to improve adhesion of a metal coating deposited upon said surfaces from an electroless plating bath, said method, comprising exposing said surfaces to an atmosphere comprising an "effective amount of ozone," contacting said exposed surfaces with an "effective amount of a conditioning solvent" and thereafter washing said contacted surfaces with an aqueous solution comprising an "effective amount of one or more surfactants". Polymer materials treated in accordance with the process of this invention are especially useful as the polymeric substrate in electroless plating processes. Such materials can be electroless plated immediately after pretreatment or at any time after pretreatment to provide uniformly metal coated plastic surfaces having exceptionally high adhesive properties as compared to metal coated plastic surfaces in which the polymeric substrate has not been pre-treated. Following the electroless plating procedure additional metal can be plated onto the resulting metal plated surfaces through use of conventional electroplating or electroless plating techniques.

One unique advantage of the modified ozone etch process of this invention as compared to the ozone etch process of U.S. Pat. No. 4,422,907 is that it is believed that the treatment with one or more surfactants prolongs the hydrophilic nature of the conditioned surfaces so that the treatment of the conditioned surfaces with the electroless plating catalyst can be delayed for long periods of time yet still provide an acceptable metal plate. This advantage is very valuable in a commercial context.

Plastic materials which have been pretreated and metal plated in accordance with this invention are useful for many purposes. For example, such metal plated plastic materials can be used for EMI/RFI shielding applications, for decorative purposes and/or for protection. Such metal plated plastics can also be used in the manufacture of printed circuit boards and to increase the strength and surface conductance of plastics. The process of this invention also provides parts which are considerably lighter than solid metal parts, yet which still possess metal conductive properties, metal surface characteristics and other like metal characteristics.

DETAILED DESCRIPTION OF THE INVENTION

The process of this invention includes three essential steps. In the first essential step, the surfaces of the plastic material to be pretreated are exposed to an atmosphere containing an "effective amount of ozone". As used herein, an "effective amount of ozone" is an amount of ozone which when contacted with the surfaces of a plastic material is effective to etch such surfaces such that subsequent treatment of said surfaces with an "effective amount of a conditioning solvent" (as hereinafter defined) and an "effective amount of one or more surfactants" (as hereinafter defined) followed by treatment of said surfaces with one or more electroless plating catalyst and electroless plating of a metal thereon (immediately or after prolonged periods of time) will provide a metal coating having enhanced adhesive properties as compared to the adhesive properties of metal coated onto untreated surfaces. While not intended to limit the scope of the invention in any way, it is believed that the ozone functions to etch the treated surfaces and the conditioning solvent then renders them hydrophilic. Normally, the greater the weight percent of ozone in the exposing atmosphere, the greater the degree of etching and the greater the increase in the hydrophilic character of the treated surfaces upon treatment with the conditioning solvent. Conversely, the less the amount of ozone in the exposing atmosphere, the less the degree of etching and the less the increase in the hydrophilic character of the treated surfaces upon treatment with the conditioning solvent. The quantity of ozone employed in a particular situation will depend on a number of factors, as for example the exposing temperature, the susceptibility of the particular plastic material to attack by ozone and the duration of exposure. Thus, variations in these parameters can greatly increase or decrease the speed and/or degree of etching and the extent to which the hydrophilic character of the plastic surfaces are modified; and thus, smaller or larger quantities of ozone can be employed depending on whether these operational parameters are maximized or minimized. In general, however, when employing preferred operational parameters, good results are achieved when the quantity of ozone is at least about 0.1 weight percent based on the total weight of gases in the exposing atmosphere surrounding the plastic surfaces being conditioned. In the preferred embodiments of this invention, the quantity of ozone which is employed is at least about 0.5 weight percent based on the total weight of gases in the atmosphere, and in the particularly preferred embodiments of this invention, the quantity of ozone is at least about 1.0 weight percent on the same basis. Amongst these particularly preferred embodiments, those in which the quantity of ozone is at least about 2.5 weight percent based on the total weight of gases are most preferred.

The upper weight percent of ozone is not critical, and best results would be achieved if an atmosphere composed of 100% ozone is employed. However, due to the economics of ozone generation and/or the difficulty inherent in the generation of atmospheres composed of more than about 30 weight percent ozone, atmospheres composed of higher amounts of ozone are normally not used.

As is apparent from the foregoing, the ozone containing atmosphere is not 100% ozone and will most often include one or more inert carrier gases. Preferably this carrier gas is oxygen. However, other gases may also be used for this purpose including air, nitrogen, carbon dioxide, noble gases, mixtures of the foregoing gases and other gases which meet the requirement of nonreactivity with ozone.

Process temperatures are not critical and can be varied as desired, provided, however, that the temperature is low enough to prevent substantial deformation of the plastic material being conditioned, and further provided that the temperature is high enough to allow favorable ozone on plastic reaction kinetics to occur. In addition, excessively elevated temperatures are preferably avoided so as to prevent or retard an unacceptably high reversion of ozone to oxygen. Because of these interacting phenomena, a strong relationship between ozonation temperatures, ozone concentrations and exposure time exists. When operating under preferred conditions, the process can be conveniently carried out at a temperature as low as about −30° C. and lower, and up to a temperature of about 150° C. and higher depending on the particular plastic material being etched. The process is usually carried out at a temperature of between about 45° C. and about 100° C., and preferably from about 50° C. to about 90° C.

Process pressures are also not critical and can be varied widely. The process can be carried out at sub-atmospheric, atmospheric or super-atmospheric pressure. It is recognized, based on the principle of Le-Chatelier, that beneficial reaction characteristics can be brought about at super atmospheric pressures. However, the process is usually conducted at atmospheric or autogenous pressure for convenience.

In the first step of the process of this invention, the plastic material is exposed to the ozone atmosphere for a time sufficient to etch the surfaces of such material such that on subsequent treatment with strong base and surfactant, the hydrophilic nature of surface is established and prolonged such that the adhesion of a metal coating electroless plated on said surfaces is improved to the extent desired. As was noted hereinabove, the duration of exposure will depend on a number of factors including, exposure temperatures, quantity of ozone in the exposing atmosphere and the like. Exposure times are not critical and can be varied over a wide range as desired provided that the aforementioned result is obtained. For example, exposure times can vary from about a few seconds up to about 24 hours or more. In most instances, however, exposure times will vary from about 1 to about 5 seconds up to about 1 to about 2 hours under the preferred process conditions, and these exposure times represent the preferred range of exposure times.

It should be appreciated that the preferred exposure time, exposure temperature and concentration of ozone in the exposing atmosphere for any particular application will depend on the type of plastic material being subjected to the process of this invention. Thus, the preferred set of process parameters for any particular application will preferably be selected in accordance with the chemical structure and reactivity of the plastic material in such a manner that optimum etching of the surface and changes in the hydrophilic character of the surface for a particular purpose is provided.

The plastic material selected for use in the process of this invention should contain functional groups which are susceptible to reaction with ozone, preferably those containing one or more unsaturated chemical bonds. Such materials include naturally occurring polymers, and plastics and other synthetic polymeric materials which may be thermoplastic, thermosetting and elastomeric polymers.

Illustrative of useful thermoplastic polymers are polyolefins, such as high or low density polyethylene, polypropylene, polyfluoroethylene, ethylene-propylene copolymers and the like; polysulfide; polyacetals; polyvinyl chloride and copolymers thereof; polyvinyl acetate, and the like; polysulfones; polystyrenes and acrylonitrile-butadiene-styrene copolymers and the like; polyamides, such as poly(hexamethylene adipamide), polycaprolactam, poly(hexamethylene sebacamide), poly(undecamide), and the like; polyphenylene oxide; saturated polyesters, such as polyalkolene terephthalate, and the like; polycarbonates; polyacrylic polymers, such as poly(methacrylate), polyacrylic acid, polyacrylonitrile, and the like; cellulose esters; and polyurethanes or polyamideimides. Exemplary of useful thermosetting polymers suitable for use in this invention are phenolic resins; aminoplastic; unsaturated polyesters; polyepoxides, and polyimides; and illustrative of useful elastomers are natural or synthetic rubbers, silicone rubbers, polyurethane elastomers and the like.

Preferred for use in the process of this invention are polymers containing carbon/oxygen double bonds, carbon/carbon triple bonds and carbon/carbon double bonds. Illustrative of such polymers are such as Nylon 66 (poly(hexamethylene adipamide)), Nylon 6 (polycaprolactam) and the like; polyacetylenes; polyisoprene; butadiene/styrene copolymer; polychloroprene; unsaturated polyesters; ABS (a block copolymer of acrylonitrile, butadiene and styrene); polybutadiene; and polyesters, such as poly(ethylene terephthalate). Also, preferred for use are polymers such as polysulfides, polyacetals, polysulfones, polyphenylene oxides and the like. Particularly preferred for use in the process of this invention are homo-polymers and, random, block and/or graft copolymers which include recurring carbon/carbon double bonds such as acrylonitrile-butadiene-styrene copolymers, polybutadiene, polyisoprene, butadiene/styrene copolymer, unsaturated polyesters, and like plastics having carbon/carbon double bonds in the polymer chain and polysulfides, polysulfones, polyacetals and polyphenylene oxides.

The method of producing the ozone containing atmosphere employed in the process of this invention is not critical and conventional procedures may be employed. For example, the ozone component can be generated from air, providing a useful atmosphere composed of ozone and air. Ozone generators are commercially available in differing sizes ranging from small laboratory models to very large generators used in water treatment. Any of these conventional types of generators can be employed in the practice of this invention. Ozone generators are especially useful in the conduct of the process of this invention in that they are easily turned on and off to generate ozone as required, and thus, their use can prevent the generation of large quantities of excess ozone. Even though ozone has no reported long term toxic effects, and can be detected by smell at concentrations as low as 0.1 ppm, it is generally advisable not to produce large excesses of any chemical. In the event that large excesses are produced, the unused ozone can be catalytically reduced to oxygen with manganese dioxide or alumina to prevent any potential pollution problems.

In the second essential step of the process of this invention, the treated plastic surfaces are contacted with an "effective amount of a conditioning solvent". As used herein, an "effective amount of a conditioning solvent" is an amount of a solvent which when contacted with a plastic surface previously exposed to an effective amount of ozone is capable of removing the ozone/plastic degradation products from the ozone contacted surface to render the surface hydrophilic and to provide a treated surface on which a metal coating having improved peel strength can be deposited by conventional electroless and electrolytic plating techniques. Illustrative of useful conditioning solvents are solutions of "strong bases." As used herein "strong base" is a base which can form an aqueous solution having a pH of at least about 8, and preferably at least about 10. Exemplary of useful strong base solutions are solutions of alkali and alkaline earth metal hydroxides and alkoxides, as for example, sodium hydroxide, potassium hydroxide, lithium hydroxide, sodium methoxide, sodium ethoxide, and non-metal hydroxides as for example ammonium hydroxide in a solvent which can solvate the base and which is not reactive with such bases.

Illustrative of useful nonreactive solvents are water and polar organic solvents such as ethyl acetate, ethanol, methanol, dimethyl formamide, dimethyl sulfoxide and the like. In the particularly preferred embodiments of this invention, an aqueous solution of a strong inorganic base, as for example, sodium hydroxide, lithium hydroxide, potassium hydroxide, ammonium hydroxide and the like is employed. The concentration of base in the solvent is preferably at least about 0.001 weight percent, and in the particularly preferred embodiments is in the range of from about 2 to about 30 weight percent based on the total weight of the solvent. Amongst these particularly preferred embodiments, solutions having a base content of from about 5 to about 10 weight percent on the same basis are most preferred.

In the third essential step of the process of this invention, the surfaces are treated with an aqueous solution comprising a "effective amount of one or more useful surfactants". As used herein, an "effective amount of one or more useful surfactants" is an amount of the surfactants which is sufficient to enable the surfaces to remain in a conditioned hydrophilic state over a period of time. In general, the amount of the one or more surfactants contained in the solution is at least about 0.0001 weight percent based on the total weight of the solution. The upper limit to the amount of surfactants is not critical, and is dictated primarily by economic considerations. In the preferred embodiments of the invention, the amount of the surfactant contained in the solution is from about 0.0001 to about 20 weight percent based on the total weight of the solution, and in the particularly preferred embodiments of the invention, the amount of the surfactant is from about 0.001 to about 10 weight percent on the same bases. Amongst these particularly preferred embodiments of the invention, most preferred are those embodiments in which the amount of said one or more surfactants in said solution is from about 0.01 to about 1 weight percent based on the total weight of the solution.

The type of surfactant employed is not critical and can be varied widely. Useful surfactants may be amphoteric, anionic, cationic or nonionic in nature, or a combination of such surfactants can be employed.

Examples of suitable anionic surfactants are alkali metal, ammonium and amine soaps; the fatty acid part of such soaps contains preferably at least about 16 carbon atoms because soaps based on lauric and myristic acids have a greater tendency to develop an abundant foam as compared to soaps based on other fatty acids. Other examples of suitable anionic surfactants are alkali metal salts of alkyl-aryl sulfonic acids, sodium dialkyl sulfosuccinate, sulfated or sulfonated oils, e.g., sulfated castor oil; sulfonated tallow, and alkali salts of short chain petroleum sulfonic acids.

Examples of suitable cationic surfactants are salts of long chain primary, secondary, or tertiary amines, such as oleylamine acetate, cetylamine acetate, didodecylamine lactate, the acetate of aminoethyl-aminoethyl stearamide, dilauroyl triethylene tetramine diacetate, 1-aminoethyl-2-heptadecenyl imidazoline acetate; and quaternary salts, such as cetylpyridinium bromide, hexadecyl ethyl morpholinium chloride, and diethyl di-dodecyl ammonium chloride.

Examples of suitable nonionic surfactants are condensation products of higher fatty alcohols with alkylene oxides, such as the reaction product of oleyl alcohol with 10 ethylene oxide units; condensation products of alkylphenols with alkylene oxides, such as the reaction products of isooctylphenol, octylphenol and nonylphenol with from about 12 to about 30 ethylene oxide units; condensation products of higher fatty acid amides with 5 or more alkylene oxide units such as ethylene oxide units; polyethyl glycol esters of long chain fatty acids, such as tetraethylene glycol monopalmitate, hexaethyleneglycol monolaurate, nonaethyleneglycol dioleate, tridecaethyleneglycol monoarachidate, tricosaethylene glycol monobehenate, tricosaethyleneglycol dibehanate, polyhydric alcohol partial higher fatty acid esters such as sorbitan tristearate, ethylene oxide condensation products of polyhydric alcohol partial higher fatty esters, and their inner anhydrides (mannitol-anhydride, called Mannitan, and sorbitol-anhydride, called Sorbitan), such as glycerol monopalmitate reacted with 10 molecules of ethylene oxide, pentaerythritol monooleate reacted with 12 molecules of ethylene oxide, sorbitan monostearate reacted with 10 to 15 molecules of ethylene oxide; long chain polyglycols in which one hydroxyl group is esterified with a higher fatty acid and the other hyroxy group is etherified with a low molecular alcohol, such as methoxypolyethylene glycol 550 monostearate (550 meaning the average molecular weight of the polyglycol ether). A combination of two or more of these surfactants may be used. For example, a cationic surfactant may be blended with a nonionic surfactant, or an anionic surfactant with a nonionic surfactant.

Preferred for use in the practice of this invention are nonionic surfactants, or mixtures of nonionic and anionic surfactants. Particularly preferred for use in the practice of this invention are nonionic surfactants. Preferred nonionic surfactants for use in the practice of this invention are alkylarylpolyethers, such as the condensation products of alkylphenols, such as octylphenol, nonylphenol and isooctylphenol, and alkylene oxides, such as ethylene oxide; fatty acid alkanol amides; polyalkoxylated alcohols, such as polyethoxylated 3-tridecanol, isotridecyl alcohol adduct with ethylene oxide; and fatty alcohol polyethers.

After conditioning through use of the process of this invention the surfaces can be exposed to air and/or allowed to dry for prolonged periods of time, as for example for a few seconds or one or more days, without adversely affecting the quality of the metal plate or peel strength upon subsequent electroless plating. Surfaces conditioned through use of the process of this invention can be electroless plated through use of conventional procedures, which may be followed by electroplating also by conventional means, to provide polymeric materials and polymeric articles having uniform and well adhering copper, brass, cadmium, chromium, nickel, gold, silver, platinum, zinc and like metal surface layers having enhanced peel strength.

Polymeric materials treated in accordance with the process of this invention followed by conventional electroless plating, and optionally by electroplating, have many uses. For example, such plated surfaces can be used for EMI/RFI shielding on electronics housings as well as for decorative purposes. The metal surfaces also provide a protective covering against abrasion and the like. In addition, plastic materials metal plated in accordance with the process of this invention can be used in the manufacture of printed circuit boards. Such boards are flat plastic plates plated with metals such as copper and the like through use of conventional techniques.

The following specific examples are presented to more particularly illustrate the invention.

EXAMPLE I

Samples of an acrylonitrile/butadiene/styrene copolymer manufactured and marketed by Borg Warner, Inc. under the trade designation Cycolac ® KJB are placed in sealed reaction chambers in the lab or pilot plant. The chambers are equipped with direct contact heating and circulation capabilities. Gas inlet and outlet orifices are provided enabling the passage of a carrier gas capable of etching the copolymer. The etchant employed in this reaction is ozone. The ozone is produced using a generator manufactured by the Welsbach Corporation and sold under the tradename Welsbach Laboratory Ozonator, Model T-23. The carrier gas is allowed to flow through the chamber at a constant rate of about 800 cc/min. Heating and circulation are initiated to quickly elevate the reaction temperature to the desired level. When the reaction temperature is established, circulation is discontinued and ozone is introduced. This is the beginning of the reaction and the concentration of ozone in the reactor is essentially zero. The reaction is allowed to continue for a given period of time. Circulation of the ozone is then reinitiated thus effecting a homogeneous ozone atmosphere having a final concentration of about 2.2 percent by weight. Ozone concentration is monitored using a model HC, PCI Ozone Corp. Ozone Analyzer.

Following ozone exposure, the samples are treated with an aqueous sodium hydroxide solution having a concentration of about one percent by weight for about 10 minutes at room temperature. After treatment with the base solution, the samples are air dried over a period of from about 90 seconds to about 10 minutes. The samples are then rinsed with an aqueous solution containing 0.05 weight percent PM-900 (a surfactant mixture of alkylarylpolyether, fatty acid alkanolamide, polyalkoxylated alcohol, isopropanol and ammonia manufactured and sold by Shipley Co.) for from about 1 to 2 minutes followed by air drying over a period of from 90 seconds to 17 hours.

Subsequent treatment involves electroless plating techniques which are as follows. In this technique, the samples are immersed in an aqueous activator solution containing 0.8% of Macuplex Activator D-34, from MacDermid Inc. (aqueous solution containing palladium, stannous, stannic, and hydrogen chloride) (hereinafter referred to as "D-34") and 20% concentrated hydrochloric acid at 28° C. for 2 to 5 minutes and rinsed for 1 minute in distilled water at room temperature. They are then immersed in an aqueous accelerator solution containing 10% of Macuplex Accelerator D-45, from MacDermid Inc. (aqueous solution containing HCl and stannic chloride) (hereinafter referred to as "D-45") at 50° C. for 2 minutes and again rinsed in water distilled for 1 minute at room temperature. The samples are then placed in an electroless copper or nickel plating bath. The copper bath is prepared by mixing 6% by volume Enplate Cu-750A (Enthone Inc.), 5% by volume Enplate Cu-750B (Enthone Inc.), 2.25% by volume Enplate Cu-750C (Enthone Inc.), and 0.5% by volume 37% formaldehyde. The samples are immersed in this bath for 15 minutes at 25° C. followed by a 1-minute rinse with water. The electroless nickel plating bath is prepared by mixing 6% by volume Enplate Ni-414A and 9% Enplate NI-414B, (Enthone Inc.). The pH of the solution is adjusted to about 8.8 to 9 with ammonium hydroxide. The samples are immersed in this bath for about 10 minutes at 25° C. followed by a 1-minute rinse with water. This is completed at 25° C. for about 5 minutes followed by a 1-minute rinse with water.

Certain of the samples are now plated electrolytically with copper as follows:

(1) These samples are first given a "copper strike" in which the samples are immersed in an air-agitated aqueous bath containing 45 g/L of copper sulfate, 5.5% by volume of sulfuric acid and 50 ppm of cupric chloride.

(2) Following the copper strike, the samples are placed in a bright acid copper bath to deposit 5.08 to 15.24 μm of copper plate. The bath is composed of 210 g/L of copper sulfate, 3.2% by volume of sulfuric acid, 50 ppm of cupric chloride, 0.16% by volume of a conventional carrier/primary brightener, 0.16% by volume of a conventional brightener/leveler and 0.6% by volume of a conventional brightener/leveler support additive.

The adhesion characteristics of electroless and electrolytic plate on the samples are then determined. A stringent test of adhesive quality particularly for EMI/RFI applications involves thermal cycling of the plated plastic. In these experiments, plated plastics have to survive at least three successive −40° C. to +80° C. temperature cycles without blistering, cracking, peeling or incurring any other physical deterioration. Electrolessly plated plastics were also subjected to a qualitative tape peel test. The plating was cross hatched with a razor blade and adhesive tape (Scotch Magic Tape 810) applied firmly to the cross hatched surface. The tape was peeled off rapidly and the amount of plating peeled off noted. An acceptable rating for plated plastic required that no metal be peeled off in this test.

Some electrolytically plated metal coatings were subjected to a "Peel Test" as follows:

1. Two parallel incisions approximately 25.00±0.25 mm apart and approximately 75 mm long are cut in the electroplated metal coating, producing a strip.

2. Using a sharp chisel or knife, peel back an ~15 mm tab of the strip.

3. Restrain the plaque in a way that permits separating the strip.

4. Attach the tab to a spring-loaded tester.

5. Separate the strip from the plaque at an angle of 90±5 deg to the plaque and at a rate of 25±3 mm/min.

6. During the separation the force on the indicator will rise to a peak value and fall back. The peak value is a peel value.

The process parameters and results are set forth in the following Table I. In Table I, the abbreviations are defined as follows:

(a) "El Cu" is electrolytic plated copper.
(b) "TCT" is thermal cycle test.
(c) "ST" is stratch test.
(d) "EP" is electroless plated.
(e) "Cu" is copper.
(f) "Ni" is nickel.
(g) "--" indicates that processing step was not carried out.
(h) "RT" is room temperature.
(i) "PEEL" is peel strength in N/cm.
(J) "i" is current density in amps/cm$^2$.

TABLE I

| Process Parameter | 1 | 2 | 3 | 4 | 5 | 6 | 7(a) | 7(b) | 8 | 9* | 10 | 11 | 12 | 13 | 14** |
|---|---|---|---|---|---|---|---|---|---|---|---|---|---|---|---|
| 1. O₃ Etching: | | | | | | | | | | | | | | | |
| (a) time | 20 min | 20 min | 1 hr | 1 hr | 1 hr | 1 hr | 20 min | 20 min | 1 hr | 1 hr | 1 hr | 1 hr | 1 hr | 1 hr | 1 hr |
| (b) temp | 90° C. | 90° C. | 80° C. | 80° C. | 80° C. | 80° C. | 90° C. | 90° C. | 80° C. | 80° C. | 90° C. | 90° C. | 90° C. | 90° C. | 90° C. |
| 2. Conditioning: | | | | | | | | | | | | | | | |
| (a) % NaOH | 10% | 10% | 10% | 10% | 10% | 10% | 10% | 10% | 10% | 20% | 10% | 10% | 10% | 10% | 1% |
| (b) time | 10 min | 10 min | 10 min | 10 min | 10 min | 10 min | 10 min | 10 min | 10 min | 10 min | 10 min | 10 min | 10 min | 10 min | 10 min |
| (c) temp | 30° C. | 30° C. | 25° C. | 25° C. | 32° C. | 32° C. | 32° C. | 32° C. | 32° C. | 26° C. | 25° C. | RT | RT | RT | RT |
| 3. Air Dry: | | | | | | | | | | | | | | | |
| (a) time | — | 1 min | 2 min | — | — | 1 min | 2 min | 2 min | 1 min | 1 min | 1 min | 1 min | 1 min | — | 1 min |
| 4. Rinsing: | | | | | | | | | | | | | | | |
| (a) rinsing material | DI H₂O | 0.05% PM-900 | DI H₂O | DI H₂O | DI H₂O | DI H₂O | DI H₂O | DI H₂O | DI H₂O | 1% PM-900 | 1% PM-900 | DI H₂O | 0.05% PM-900 | 0.05% PM-900 | DI H₂O |
| (b) time | 1 min | 1 min | 1 min | 1 min | 1 min | 1 min | 1 min | 1 min | 1 min | 1 min | 1 min | 1 min | 1 min | 1 min | 1 min |
| 5. Air Dry: | | | | | | | | | | | | | | | |
| (a) time | 2 min | 2 min | 2 min | — | 2 min | 2 min | 2 min | 2 min | 2 min | 2 min | 2 min | 2 min | 2 min | 2 min | 2 min |
| 6. EP: | | | | | | | | | | | | | | | |
| (a) Metal | Ni | Ni | Cu | Cu | Cu | Ni | Ni | Cu | Ni | Ni | Ni | Ni | Ni | Ni | Ni |
| (b) time | 5 min | 5 min | 15 min | 15 min | 15 min | 5 min | 5 min | 15 min | 5 min | 5 min | 5 min | 5 min | 5 min | 5 min | 5 min |
| (c) Result | complete plate | complete plate | incomplete plate | complete plate | incomplete plate | incomplete plate | incomplete plate | incomplete plate | incomplete plate | complete plate | complete plate | incomplete plate | complete plate | complete plate | complete plate; dull |
| 7. El Cu: | | | | | | | | | | | | | | | |
| (a) i | — | — | — | — | — | — | — | — | — | — | — | — | — | — | — |
| (b) time | — | — | — | — | — | — | — | — | — | — | — | — | — | — | — |
| 8. Evaluating: | | | | | | | | | | | | | | | |
| (a) TCT | — | — | — | — | — | — | — | — | — | — | — | — | — | — | pass |
| (b) ST | — | — | — | — | — | — | — | — | — | — | — | — | — | — | pass |
| (c) PEEL | — | — | — | — | — | — | — | — | — | — | — | — | — | — | — |
| (d) thickness | — | — | — | — | — | — | — | — | — | — | — | — | — | — | — |

*Surface was conditioned with an aqueous solution of ethanol/KOH (3:1)
**Conditioning solution also contained 0.05% PM-900.

| Process Parameter | 15 | 16 | 17 | 18 | 19 | 20 | 21 | 22 | 23 | 24 | 25 | 26 | 27 | 28 | 29 |
|---|---|---|---|---|---|---|---|---|---|---|---|---|---|---|---|
| 1. O₃ Etching: | | | | | | | | | | | | | | | |
| (a) time | 1 hr | 1 hr | 1 hr | 1 hr | 1 hr | 1 hr | 1 hr | 1 hr | 1 hr | 1 hr | 1 hr | 1 hr | 1 hr | 1 hr | 1 hr |
| (b) temp | 90° C. | 90° C. | 90° C. | 90° C. | 90° C. | 90° C. | 90° C. | 90° C. | 90° C. | 90° C. | 90° C. | 90° C. | 90° C. | 90° C. | 90° C. |
| 2. Conditioning: | | | | | | | | | | | | | | | |
| (a) % NaOH | 1% | 1% | 1% | 1% | 1% | 1% | 1% | 1% | 1% | 1% | 1% | 1% | 1% | 1% | 1% |
| (b) time | 10 min | 10 min | 10 min | 10 min | 10 min | 10 min | 10 min | 10 min | 10 min | 10 min | 10 min | 10 min | 10 min | 10 min | 10 min |
| (c) temp | RT | RT | RT | RT | RT | RT | RT | RT | RT | RT | RT | RT | RT | RT | RT |
| 3. Air Dry: | | | | | | | | | | | | | | | |
| (a) time | — | 1 min | 5 min | 10 min | 90 sec | 30 min | 90 sec | 90 sec | — | 1 hr | 5 min | 10 min | 10 min | 90 sec | — |
| 4. Rinsing: | | | | | | | | | | | | | | | |
| (a) rinsing material | DI H₂O | 0.05% PM-900 | PM-900 | 0.05% PM-900 | 0.05% PM-900 | 0.05% PM-900 | DI H₂O | 0.025% PM-900 | DI H₂O | 0.05% PM-900 | 0.025% PM-900 | 0.025% PM-900 | 0.025% PM-900 | 0.025% PM-900 | DI H₂O |
| (b) time | 1 min | 1 min | 1 min | 1 min | 1 min | 1 min | 1 min | 1 min | 1 min | 1 min | 1 min | 1 min | 1 min | 1 min | 1 min |

TABLE I-continued

| Process Parameter | | 30 | 31* | 32** | 33*** | 34*** | 35*** | Experiment Number 36*** | 37 | 38 | 39*** | 40*** | 41*** | 42 |
|---|---|---|---|---|---|---|---|---|---|---|---|---|---|---|
| 5. Air Dry: | | | | | | | | | | | | | | |
| | (a) time | 5 min | 5 min | 10 min | 90 sec | 30 min | 90 sec | 90 sec | 90 sec | 1 hr | 5 min | 17 hrs | 10 min | 90 sec | 90 sec |
| 6. EP: | | | | | | | | | | | | | | |
| | (a) metal | Ni | Ni | Ni | Ni | Ni | Ni | Ni | Ni | Ni | Ni | Ni | Ni | Ni | Ni |
| | (b) time | 5 min | 5 min | 5 min | 5 min | 5 min | 10 min | 5 min | 5 min | 5 min | 5 min | 5 min | 20 min | 5 min | 5 min | 5 min |
| | (c) result | complete plate | complete plate | complete plate | incomplete plate | complete plate | incomplete plate | complete plate | complete plate | complete plate | complete plate | complete plate | complete plate | incomplete plate | incomplete plate on edges |
| 7. El Cu: | | | | | | | | | | | | | | |
| | (a) i | — | — | — | — | — | — | 0.023 | 0.023 | 0.023 | 0.023 | 0.023 | 0.039 | 0.023 | 0.046 | 0.046 |
| | (b) time | — | — | — | — | — | — | 1hr | 1 hr | 1 hr | 1 hr | 45 min | 40 min | 1 hr | 1 hr | 1 hr |
| 8. Evaluating: | | | | | | | | | | | | | | |
| | (a) TCT | — | pass | pass | — | — | — | — | — | — | — | — | — | — | — |
| | (b) ST | — | pass | pass | — | — | — | — | — | — | — | — | — | — | — |
| | (c) PEEL | — | — | — | — | — | — | 9.2 | 7.4 | 7.0 | 6.6 | 6.1 | 6.2 | 6.7 | >40 μm | — |
| | (d) thickness | — | — | — | — | — | — | 44 μm | 51 μm | 50 μm | 41.8 μm | 30.1 μm | 22 μm | 38.4 μm | 34.8 μm | — |

| Process Parameter | | 30 | 31* | 32** | 33*** | 34*** | 35*** | 36*** | 37 | 38 | 39*** | 40*** | 41*** | 42 |
|---|---|---|---|---|---|---|---|---|---|---|---|---|---|---|
| 1. O₃ Etching: | | | | | | | | | | | | | | |
| | (a) time | 1 hr | 1 hr | 1 hr | 1 hr | 2 hrs | 2 hrs | 2 hrs | 2 hrs | 90 min | 90 min | 90 min | 90 min | 90 min |
| | (b) temp | 90° C. | 90° C. | 90° C. | 90° C. | 90° C. | 90° C. | 90° C. | 90° C. | 100° C. | 100° C. | 100° C. | 100° C. | 100° C. |
| 2. Conditioning: | | | | | | | | | | | | | | |
| | (a) NaOH | 1% | 1% | 1% | 1% | 1% | 1% | 1% | 1% | 1% | 1% | 1% | 1% | 1% |
| | (b) time | 10 min | 10 min | 10 min | 10 min | 10 min | 10 min | 10 min | 10 min | 10 min | 10 min | 10 min | 10 min | 10 min |
| | (c) temp | RT | RT | RT | RT | RT | RT | RT | RT | RT | RT | RT | RT | RT |
| 3. Air Dry: | | | | | | | | | | | | | | |
| | (a) time | — | — | — | — | 90 sec | 2 min | 5 min | 90 sec | 90 sec | 90 sec | 2 min | 5 min | 30 sec |
| 4. Rinsing: | | | | | | | | | | | | | | |
| | (a) rinsing material | DI H₂O | DI H₂O | DI H₂O | 0.05% PM-900 | 0.05% PM-900 | 0.05% PM-900 | 0.05% PM-900 | 0.05% PM-900 | 0.05% PM-900 | 0.05% PM-900 | 0.05% PM-900 | 0.05% PM-900 | 0.05% PM-900 |
| | (b) time | 1 min | 1 min | 1 min | 1 min | 2 min | 2 min | 2 min | 2 min | 2 min | 2 min | 2 min | 2 min | 2 min |
| 5. Air Dry: | | | | | | | | | | | | | | |
| | (a) time | — | — | — | 90 sec | 90 sec | 2 min | 5 min | 90 sec | 90 sec | 90 sec | 2 min | 5 min | 90 sec |
| 6. EP: | | | | | | | | | | | | | | |
| | (a) metal | Ni | Ni | Ni | Ni | Ni | Ni | Ni | Ni | Ni | Ni | Ni | Ni | Ni |
| | (b) time | 5 min | 10 min | 10 min | 15 min | 10 min | 5 min | 5 min | 5 min | 5 min | 5 min | 5 min | 5 min | 5 min |
| | (c) result | incomplete plate on edges | incomplete plate | incomplete plate | almost complete | complete plate | complete plate | complete plate | complete plate | complete plate | complete plate | one spot unplated | complete plate | complete plate |
| 7. El Cu: | | | | | | | | | | | | | | |
| | (a) i | — | — | — | — | — | 0.023 | 0.023 | — | — | — | — | — | — |
| | (b) time | — | — | — | — | — | 1hr | 1 hr | — | — | — | — | — | — |
| 8. Evaluation: | | | | | | | | | | | | | | |
| | (a) TCT | — | — | — | — | — | — | — | — | — | — | — | — | — |
| | (b) ST | — | — | — | — | — | — | — | — | — | — | — | — | — |
| | (c) PEEL | — | — | — | — | — | — | — | — | — | — | — | — | — |
| | (d) thickness | — | — | — | — | — | — | — | — | — | — | — | — | — |

*Activated for 4 mins.
**Activated for 4 mins and accelerated for 30 secs.
***Activated for 5 mins and accelerated for 30 secs.

What is claimed is:

1. In an improved process for metal plating a natural or synthetic plastic material by conditioning said material to improve metal adhesion by exposing said material to an atmosphere comprising ozone, contacting said exposed material with a conditioning solvent, and depositing a metal coating upon said conditioned surface from an electroless plating bath, wherein said improvement comprises rinsing said contacted material with an aqueous solution comprising an effective amount of one or more surfactants after contacting said material with said solvent and before depositing said metal coating.

2. A process according to claim 1 wherein said material is selected from the group consisting of polydiphenylene sulfones, polyacetals, polyphenylene sulfides and polyphenylene oxides.

3. A process according to claim 2 wherein said material is a polydiphenylene sulfone.

4. A process according to claim 2 wherein said material is polyphenylene sulfide.

5. A process according to claim 2 wherein said material is polyphenylene oxide.

6. A process according to claim 2 wherein said material is a polyacetal.

7. An improved process according to claim 1 wherein said material is selected from the group consisting of polymers containing carbon-carbon unsaturation within the polymer chain.

8. An improved process according to claim 7 wherein said material is a material selected from the group consisting of block and graft copolymers in which at least one type of the recurring monomeric units of said plastic includes carbon/carbon unsaturation.

9. An improved process according to claim 8 wherein said carbon/carbon unsaturation is a double bond.

10. An improved process according to claim 2 wherein said material is acrylonitrile-butadiene-styrene copolymer.

11. An improved process according to claim 1 wherein the quantity of ozone in said atmosphere is at least about 0.1 weight percent based on the total weight of the atmosphere.

12. An improved process according to claim 1 wherein said conditioning solvent comprises a aqueous solution of one or more strong organic or inorganic bases.

13. An improved process according to claim 12 wherein said base is selected from the group consisting of sodium hydroxide, lithium hydroxide, potassium hydroxide and ammonium hydroxide.

14. An improved process according to claim 1 wherein said one or more surfactants are selected from the group consisting of nonionic surfactants, and mixtures of nonionic and anionic surfactants.

15. An improved process according to claim 14 wherein said one or more surfactants are selected from the group consisting of nonionic surfactants.

16. An improved process according to claim 14 wherein said nonionic surfactants are selected from the group consisting of alkylarylpolyethers, fatty acid alkanol amides, polyalkoxylated alcohols, and fatty alcohol polyethers.

17. An improved process according to claim 16 wherein said nonionic surfactants are selected from the group consisting of the condensation products of alkylphenols and ethylene oxide, the adduct of isotridecyl alcohol and ethylene oxide, polyethoxylated 3-tridecanol, fatty alcohol polyethers and fatty acid alkanol amides.

18. An improved process according to claim 17 wherein said solution comprises a mixture of more than one surfactant.

19. An improved process according to claim 1 wherein the concentration of one or more surfactants in said solution is at least about 0.0001 weight percent based on the total weight of the solution.

20. An improved process according to claim 19 wherein said concentration is from about 0.0001 to about 20 weight percent.

21. An improved process according to claim 20 wherein said concentration is from about 0.001 to about 10 weight percent.

22. An improved process according to claim 21 wherein said concentration is from about 0.01 to about 1 weight percent.

23. An improved process according to claim 22 wherein said concentration is from about 0.025 to about 0.5 weight percent.

24. An improved process for plating one or more metals onto the surfaces of a plastic material which comprises:
 (a) exposing said material to an atmosphere containing ozone;
 (b) contacting said exposed material with a conditioning solvent;
 (c) rinsing said contacted material with an aqueous solution containing an effective amount of one or more surfactants; and
 (d) coating said contacted material with a catalyst for electroless plating of metal thereon;
 (e) depositing a metal coating on said catalyzed material by electroless plating.

25. An improved process according to claim 24 wherein said metal is selected from the group consisting of copper, silver, nickel and cobalt.

26. An improved process according to claim 25 which further comprises depositing one or more additional metal coatings onto said metal coated material of step e by electroplating or electroless plating.

27. An improved process according to claim 26 wherein said one or more additional metals are selected from the group consisting of copper, nickel, silver and chromium.

28. A natural or synthetic material which has been conditioned and metal plated in accordance with the process of claim 1.

29. A metal plated natural or synthetic plastic material one or more surfaces of which have been metal plated in accordance with the process of claim 24.

* * * * *